(12) United States Patent
Katashita et al.

(10) Patent No.: US 7,590,916 B2
(45) Date of Patent: Sep. 15, 2009

(54) CYCLIC REDUNDANCY CHECKING VALUE CALCULATOR

(76) Inventors: Toshihiro Katashita, c/o National Institute of Advanced Indust. Science and Technology Tsukuba Central 2, 1-1-1 Umezono, Tsukuba-shi, Ibaraki (JP) 305-8568; Kenji Toda, c/o National Institute of Advanced Indust. Science and Technology Tsukuba Central 2, 1-1-1 Umezono, Tsukuba-shi, Ibaraki (JP) 305-8568; Kazumi Sakamaki, c/o Tokyo Metropolitan Industrial Technology Research Institute, 3-13-10 Nishigaoka, Kita-ku, Tokyo (JP) 115-8568; Takeshi Inui, c/o Tokyo Metro Gov, Bureau of Waterworks Higashi-murayama Purif, Admin Office, 2-20-236 Misumi-cho, Higashi-murayama-shi, Tokyo (JP) 189-0023; Tadamasa Takayama, c/o Bureau of Transportation, Tokyo Metropolitan Government, 2-8-1 Nishi-shinjuku, Shinjuku-ku, Tokyo (JP) 163-8001; Mitsugu Nagoya, c/o DUAXES Corporation, Kasumigaseki Bldg., 3-2-5 Kasumigaseki, Chiyoda-ku, Tokyo (JP) 100-6014; Yasunori Terashima, c/o BITS Co., Ltd., D'urban Bldg., 8-8-20 Nishi-gotanda, Shinagawa-ku, Tokyo (JP) 141-0031

( * ) Notice: Subject to any disclaimer, the term of this patent is extended or adjusted under 35 U.S.C. 154(b) by 598 days.

(21) Appl. No.: 11/449,794

(22) Filed: Jun. 9, 2006

(65) Prior Publication Data

US 2007/0136411 A1   Jun. 14, 2007

(30) Foreign Application Priority Data

Dec. 9, 2005   (JP) .............................. 2005-356870

(51) Int. Cl.
  *H03M 13/09*   (2006.01)
(52) U.S. Cl. ...................................... 714/757; 714/807
(58) Field of Classification Search ................. 714/757, 714/807

See application file for complete search history.

(56) References Cited

U.S. PATENT DOCUMENTS 6,357,032 B1 *   3/2002   Plotz et al. ................... 714/758

(Continued)

*Primary Examiner*—Stephen M Baker
(74) *Attorney, Agent, or Firm*—Oblon, Spivak, McClelland, Maier & Neustadt, L.L.P.

(57) ABSTRACT

A CRC value calculator enables throughput to be improved while keeping down the increase in the size of the circuitry. This is achieved by using (n+1) basic CRC circuits to configure a CRC value calculator in which the width of the data processed during one clock cycle is $m2^n$ bits. For example, when $m2^n$ bits is the data width processed per calculator cycle, the CRC value calculator of this invention is configured by using selectors to serially connect a CRC circuit that processes every $m2^n$ bits, a CRC circuit that processes every $m2^{(n-1)}$ bits, . . . , and a CRC circuit that processes every $m2^0$ bits. This configuration makes it possible to calculate a correct CRC value even when the remainder of an input network frame is not a multiple of $m2^n$ bits. Selectors are used to select CRC circuit output according to process data width. Reduction of the operating frequency is avoided by using registers to form a pipeline between CRC circuits.

3 Claims, 14 Drawing Sheets

U.S. PATENT DOCUMENTS

| | | | |
|---|---|---|---|
| 6,519,737 B1 * | 2/2003 | Derby | 714/781 |
| 6,910,172 B2 * | 6/2005 | Hara et al. | 714/757 |
| 6,934,902 B2 * | 8/2005 | Hara et al. | 714/757 |
| 7,191,383 B2 * | 3/2007 | Lin et al. | 714/774 |
| 7,225,387 B2 * | 5/2007 | Lin et al. | 714/758 |
| 7,266,760 B1 * | 9/2007 | Bain | 714/807 |
| 7,325,081 B2 * | 1/2008 | Thomas | 710/52 |
| RE40,684 E * | 3/2009 | Keller | 714/757 |

* cited by examiner

FIG. 4

| Signal Name | Bit Length | Meaning |
|---|---|---|
| data | 64 | Input data |
| sof | 1 | Start of data input |
| eof | 1 | End of data input |
| remain | 3 | Number of remainder bytes |
| crc | 32 | Calculated CRC value |
| valid | 1 | Indicates end of CRC calculation |
| clk | 1 | Clock signal |
| rst | 1 | Resent signal |

CYCLIC REDUNDANCY CHECKING VALUE CALCULATOR

BACKGROUND OF THE INVENTION

1. Field of the Invention

The present invention relates to an error detection technique, particularly to a CRC (Cyclic Redundancy Checking) value calculator that uses cyclic codes for detecting and correcting errors in network related fields, particularly in data communications.

2. Description of the Prior Art

Cyclic code systems are well-known. How they work is that a code polynomial in which the bits of each codeword are the coefficients is divided by a generator polynomial to obtain remainder coefficients that form check bits. Then, when the codewords and the check bits are transmitted along a transmission channel in which communication errors may occur, at the receiving side, errors in transmission can be detected from the remainder obtained when the polynomial corresponding to the received information is divided by the same generator polynomial, enabling the received data to be corrected. Such cyclic code systems are used in magnetic storage devices and commercial data network devices.

CRC (Cyclic Redundancy Checking) is one error checking system. It is noted for its use of compacted cyclic codes. It is extensively employed for error checking in serial transmission channels, because it facilitates burst error detection and can be readily implemented in hardware. It is used for checking frame data in Ethernet (TM) systems. An example is 32-bit-long CRC-32 used for the FCS (Frame Check Sequence) of network frames.

FIG. 9 shows a LFSR (Linear Feedback Shift Register) which is a simple CRC circuit. This is a well-known circuit that performs CRC calculations during each clock cycle, one bit at a time.

Research continues to be carried out aimed at improving the processing performance of CRC circuitry. For example, since the unit of network frame data is the byte, research is being carried out into CRC-32 circuits that calculate the CRC value per byte. FIG. 10 shows an example of a CRC-32 circuit. The circuit shown uses exclusive OR to calculate CRC values from 8-bit data inputs. The length of the data that is processed per cycle is fixed; this 8-bit processing CRC circuit cannot calculate a CRC value from 5-bit data, for example.

Network speeds continue to improve, as shown by the recent appearance of 10-gigabit Ethernet (registered trademark), and is driving a need to similarly improve the throughput of CRC calculation processing. As a result, CRC calculators have been developed with improved throughputs that are able to process multiple bytes of data per cycle. The lengths of the data that can be processed by these calculators per cycle is fixed, and the calculators are comprised of these basic CRC circuits.

FIG. 1 shows an example of the configuration of a conventional CRC-32 calculator, in this case one in which the process data width is eight bytes per cycle. The calculator is comprised of eight CRC circuits. Including CRC circuits for processing data having widths of from one to eight bytes makes it possible to calculate the correct CRC value by selecting the CRC value result corresponding to the byte length of the remainder, even when input network data frames have remainders that are not 8-byte multiples.

FIG. 11 is a block diagram showing the configuration of a CRC-32 value calculator that is a generalized implementation of the configuration of FIG. 1, shown during the calculation of $m2^n$ bits. By including CRC circuits for data widths m, 2m, ..., $m2^n$, it is possible to calculate the correct CRC value by selecting the CRC value result corresponding to the remainder byte length.

However, in the case of these circuit configurations, increased data widths are handled by scaling up the circuitry by increasing the number of CRC circuits. This increase is accompanied by an increase in the number of CRC value selector inputs, increasing the circuit delay. When the data width is increased in the case of the conventional technology, a CRC calculator that processes $m2^n$ bits of data per cycle is configured using $m2^n$ basic CRC circuits. For example, a CRC calculator that processes a data width of $2^n$ bytes per cycle is comprised of $2^n$ basic CRC circuits consisting of a CRC circuit that processes every $2^n$ bytes, a CRC circuit that processes every $2^{n-1}$ bytes, ..., a CRC circuit that processes every one byte.

Therefore, if, for example, the width of the data processed by the CRC calculator is doubled, the number of basic CRC circuits constituting the calculator is also doubled, increasing the relative scale of the circuitry.

With respect to differences between the prior art and the present invention arising from differences in the scale of the circuitry, while with a conventional configuration the size of a CRC circuit is $2^n$, the size of a circuit is (n+1) in the case of the configuration of the present invention. The number of CRC circuits is a logarithmic scale, and the latency only increases by the amount of the logarithmic scale.

JP-A 2002-359561 discloses a CRC calculator that can receive variable-length data for processing. However, the CRC calculator comprises an input data shift circuit, a masking circuit and a CRC arithmetic unit.

The CRC calculator of the present invention comprises a number of CRC circuits that is a logarithmic order of the input data width, and selectors possessing registers, connected in series, and as such has a configuration that is different from that of JP-A 2002-359561.

SUMMARY OF THE INVENTION

The present invention provides a cyclic redundancy checking value calculator that can provide improved processing throughput while keeping down the increase in the scale of the circuitry. This resolves the above need, in ultrahigh-speed network equipment, to improve the throughput brought about by the increase in the width of data processed per CRC calculator cycle, without the swelling in the increase of the scale of circuitry of the conventional technology.

With the present invention, the width of data that can be processed by the CRC calculator can be increased while keeping down the increase in the size of the circuitry, facilitating the improvement in the throughput of the CRC calculator. That is because the increase in the scale of the circuitry is logarithmic in order, so that even if the width of the data processed per CRC calculator cycle is doubled, the basic CRC circuits constituting the calculator are only increased by one. It also enables the circuitry scale of existing CRC calculators to be decreased, thereby reducing the power consumption.

In essence, the present invention is a technology of reducing the scale of a CRC value calculator by using (n+1) basic CRC circuits to configure a CRC value calculator in which the width of the data processed during one clock cycle is $m2^n$ bits. For example, when $m2^n$ bits is the data width processed per calculator cycle, the CRC value calculator of this invention is configured by using selectors to serially connect a CRC circuit that processes every $m2^n$ bits, a CRC circuit that processes every $m2^{(n-1)}$ bits, ..., a CRC circuit that processes every $m2^0$ bits.

This configuration makes it possible to calculate a correct CRC value even when the remainder of an input network frame is not a multiple of $m2^0$ bits. A reduction in the operating frequency at this time is avoided by using registers to form a pipeline between CRC circuits.

More precisely, the CRC value calculator of the invention is one that calculates CRC values from input variable-length data, wherein, when natural numbers n, m are predetermined, calculator data is processed in $m2^n$ bit units, the CRC value calculator comprises (n+1)-fixed-length processing unit CRC circuits comprising a 0th CRC circuit in which the processing unit is a fixed length of $m2^n$ bits, a 1st CRC circuit in which the processing unit is a fixed length of $m2^{(n-1)}$ bits, continuing in order to an nth CRC circuit in which the processing unit is a fixed length of $m2^0$ bits, wherein the CRC circuits are each equipped with a register and are connected in series by respective selectors, characterized in that $m2^n$ bits of data and an output of the 0th CRC circuit itself are input to the 0th CRC circuit and, via the 0th selector, output to the 0th CRC circuit itself and to the 1st CRC circuit, and in respect of integers k from 1 to n, $m2^{(n-k)}$ bits of data and an output of the (k−1)th CRC circuit are input to the (k)th CRC circuit and, via the (k)th selector, are output to the (k+1)th CRC circuit, the 0th selector is a selector for selecting the output of the 0th CRC circuit or the output of the 0th CRC circuit itself that is the input signal, the (k)th selector is a selector for selecting one of the output of the (k−1)th CRC circuit and an output of the kth CRC circuit, and a calculated CRC value is output via the nth selector.

The CRC value calculator of the invention is also one that calculates CRC values from input variable-length data, wherein, when natural numbers n, m and a natural number t that is smaller than $m2^n$ are predetermined, calculator data is processed in $(m2^n+t)$ bit units, the CRC value calculator comprises (n+2)-fixed-length processing unit CRC circuits comprising a pre-CRC circuit in which the processing unit is a fixed length of $(m2^n+t)$ bits, a 0th circuit in which the processing unit is a fixed length of $m2^n$ bits, a 1st CRC circuit in which the processing unit is a fixed length of $m2^{(n-1)}$ bits, continuing in order to an nth CRC circuit in which the processing unit is a fixed length of $m2^0$ bits, wherein the CRC circuits are each equipped with a register and are connected in series by respective selectors, characterized in that data that is subject to CRC value calculation that has been divided into segments every $(m2^n+t)$ bits from the head thereof and input to the calculator, and output of the CRC circuit itself, are input to the pre-CRC circuit, an a CRC value calculated and, via a pre-selector, output to the CRC circuit itself and to the 1st CRC circuit, and in respect of integers k from 0 to n, $2^{n-k}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit when the data that is subject to CRC value calculation is divided into $(m2^n+t)$-bit lengths, and for selecting the output of the CRC circuit itself that is the input signal when the data that is subject to CRC value calculation is not divided into $(m2^n+t)$-bit lengths, the (k)th selector is a selector for selecting one of an output of the (k−1)th CRC circuit corresponding to the data length of the segmented data subject to CRC value calculation and an output of the (k)th CRC circuit, and a calculated CRC value is output via the (n)th selector.

The CRC value calculator of the invention is also one that calculates CRC values from input variable-length data, wherein, when natural numbers n, m are predetermined, calculator data is processed in $m2^{(n+1)}$-bit units, the CRC value calculator comprises (n+2)-fixed-length processing unit CRC circuits comprising a pre-CRC circuit in which the processing unit is a fixed length of $m2^n$ bits, a 0th CRC circuit in which the processing unit is a fixed length of $m2^n$ bits, a 1st CRC circuit in which the processing unit is a fixed length of $m2^{(n-1)}$ bits, and continuing in order, a CRC circuit in which the processing unit is a fixed length of $m2^0$ bits, and to an CRC circuit that is an (n+1)th CRC circuit in which the processing unit is a fixed length of $m2^0$, wherein the CRC circuits are connected in series by respective selectors and registers, characterized in that data that is subject to CRC value calculation that has been input to the calculator divided into segments every $(m2^n+t)$ bits from the head thereof, and register output, are input to the pre-CRC circuit, and a CRC value calculated and output to the 1st CRC circuit via a pre-selector, and in respect of integers k from 0 to n, $2^{(n-k)}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit when the data that is subject to CRC value calculation is divided into $(m2^n+t)$-bit lengths, and for selecting the output of the CRC circuit itself that is the input signal when the data that is subject to CRC value calculation is not divided into $(m2^n+t)$-bit lengths, the (n+1)th selector is a selector for selecting one of the output of the (k−1)th CRC circuit corresponding to the data lengths into which the data that is subject to CRC value calculation is divided, and the output of the (n)th CRC circuit, and a calculated CRC value is output via the nth selector.

Further features of the invention, its nature and various advantages will be more apparent from the accompanying drawings and following detailed description of the invention.

BRIEF DESCRIPTION OF THE DRAWINGS

FIG. 4 provides an outline of the signals of FIG. 3.

DESCRIPTION OF THE PREFERRED EMBODIMENT

Equation (1) expresses cyclic code F(x) when P(x) is the polynomial corresponding to the code word, n is the order, G(x) is a generator polynomial that is indivisible by $x^{(n-1)}$, and R(x) is the remainder after dividing P(x) by G(x).

$$F(x)=x^n P(x)+R(x) \quad \text{Equation (1)}$$

This compacted cyclic code is a CRC, with the first term of the equation being the address, length and data fields, and the second term corresponding to the FCS (Frame Check Sequence).

When frame data is being transmitted, the R(x) portion is calculated and appended as an FCS. On the receiving side, the R(x) is calculated from the received signal and compared to the corresponding FCS to check for data errors.

Figure 1:
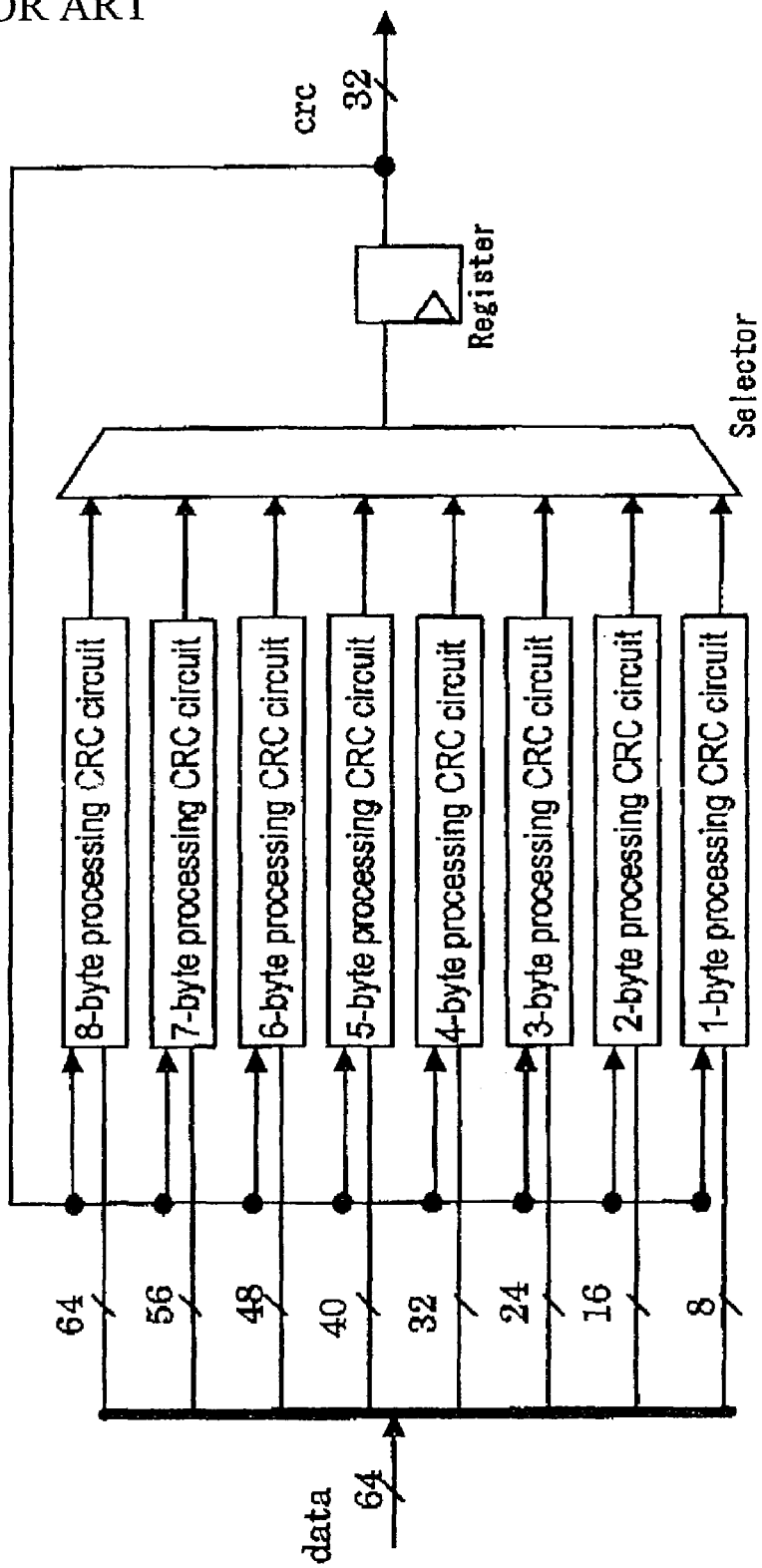
FIG. 1 is a block diagram showing the configuration of a conventional CRC-32 calculator during 8-byte processing.
Figure 2:
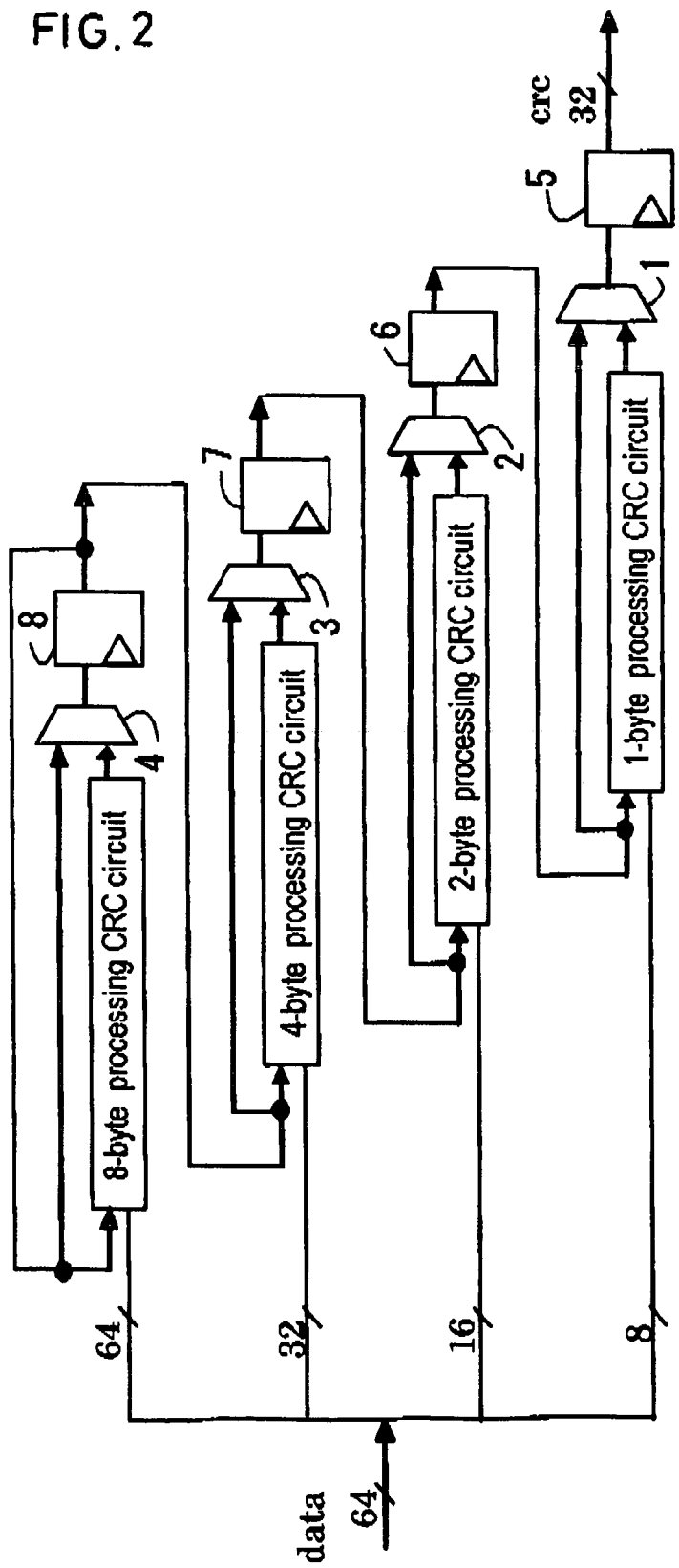
FIG. 2 is a block diagram showing the configuration of the CRC value calculator of the present invention during 8-byte processing.

The CRC calculator of the present invention that calculates CRC values in process data widths of $m2^n$ bits is comprised of a CRC circuit that processes every $m2^n$ bits, a CRC circuit that processes every $m2^{(n-1)}$ bits, . . . , a CRC circuit that processes every $m2^0$ bits, connected in series by selectors. A reduction in the operating frequency at this time is avoided by providing registers to form a pipeline between the CRC circuits. FIG. 2 shows the configuration of the CRC-32 calculator of the present invention used for processing data 8 bytes wide per cycle. Where the present invention differs from the prior art is that, while with a conventional configuration the latency in the case of $2^n$ CRC circuits is 1, the latency of (n+1) CRC circuits in the case of the configuration of the present invention is (n+1). With this invention, the number of CRC circuits is a logarithmic scale, and the latency only increases by the amount of the logarithmic scale.

Selection by selector in the case of the configuration of FIG. 2 is as follows.

If the target data length is 63 bytes and the process data width is 8 bytes, the target data is divided into eight segments and 8 bytes of data are input into the first to seventh segments. The length of the remainder in the eighth segment is 7 bytes (0111 in binary notation). That is 4 bytes plus 2 bytes plus 1 byte, so the selector after the 8-byte processing CRC circuit directly selects from the register the signal initially stored as 0 which does not contribute to the CRC value; the selectors after the 4-byte, 2-byte and 1-byte processing CRC circuits select 4-byte processing, 2-byte processing and 1-byte processing, respectively, which portions are made to be valid contributors to the CRC value.

When the target data length is 59 bytes, meaning the remainder is 3 bytes, the selector after the 8-byte processing CRC circuit directly selects from the register the signal initially stored as 0, which is followed by the selector after the 4-byte processing CRC circuit selecting the output of the 8-byte processing CRC circuit that outputs 0, to utilize 2-byte processing CRC circuit and 1-byte processing CRC circuit to calculate the CRC value of the 3-byte remainder.

If the target data length is a multiple of 8, only the 8-byte processing CRC circuit is used, so contributions from the 4-byte to 1-byte processing CRC circuits are invalidated.

When general notation is used, the selector used is one that selects the CRC circuit having the number of bytes corresponding to the digits of the length of the final segment data after division by the process data length, expressed in binary notation. Thus, when $m2^n$ bits is the process data width, the first-stage selector selects CRC circuit output when the data length is $m2^n$, and with the selector of the (k)th stage, whether to select or not select the output of the (k)th CRC circuit is determined according to the value of the digit corresponding to the (k)th selector in the binary notation of the length of the remainder data.

Next, an example of the processing procedure used by the CRC calculator will be described in further detail with reference to FIG. 2, in a case in which the target data length is 21 bytes and the process data width is 8 bytes; that is, with respect to the 8 bytes plus 8 bytes plus 5 bytes of the first to third segments.

(1) First, the 8 bytes of data of the first segment are input.

The 8-byte processing CRC circuit is used to calculate an interim CRC value, and selector 4 selects the output of the 8-byte processing CRC circuit, which is input to register 8.

(2) Next, the 8 bytes of data of the second segment are input.

Here, the above interim result in the register 8 and the input data are used for the calculation of an interim CRC value by the 8B processing CRC circuit, and the selector 4 selects the output of the 8B processing CRC circuit, which is input to register 8.

(3) Next, the 5 bytes of data of the third segment are input.

The selector 4 selects the output directly from the register 8, which is input to the register 8. Also, a CRC value is calculated by the 4-byte processing CRC circuit from the interim result in the register 8 and 4 bytes (bytes 17 to 20) of the input data.

The selector 3 selects the output of the 4-byte processing CRC circuit, which is input to the register 7.

The selector 2 selects the output directly from the register 7, which is input to the register 6.

Also, a CRC value is calculated by the 1-byte processing CRC circuit from the interim result in the register 6 and 1 byte (byte 21) of the input data.

The selector 1 selects the output of the 1-byte processing CRC circuit, which is input to the register 5.

(4) The CRC value is output.

EXAMPLE 1

The first example of the CRC value calculator of the invention will be described with reference to a calculator for calculating the CRC value of a CRC-32 (also called a (FCS) Frame Check Sequence) used by an Ethernet (registered trademark) frame. CRC-32 is used for frame error detection of Ethernet (registered trademark) data link layer frames. CRC-32 is used as an FCS in the data link layer frames of IEEE 802.3; a CRC-32 value is calculated from the frame address, length and data fields. The CRC value (check bit) in this case is 32 bits long, the generator polynomial being $$G(x)=x^{32}+x^{26}+x^{23}+x^{22}+x^{16}+x^{12}+x^{11}+x^{10}+x^8+x^7+x^5+x^4+x^2+x^1+1 \quad \text{Equation (2)}$$

Figure 6:
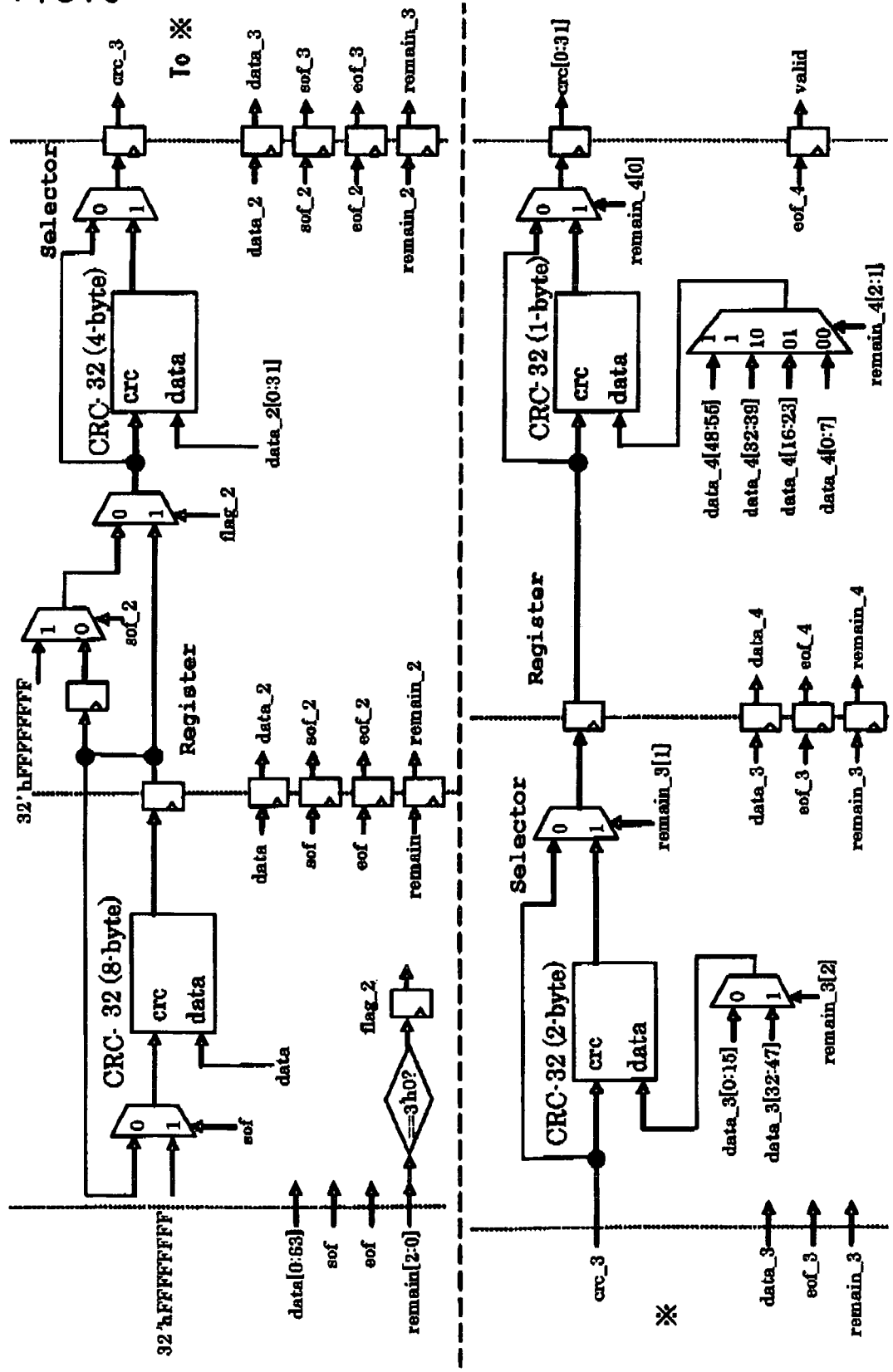
FIG. 6 is a block diagram showing the configuration of a CRC-32 value calculator.

FIG. 6 shows the configuration of a CRC-32 value calculator. The process data width of a FCS device that uses CRC-32 is 8 bytes; when the device operating frequency is 156.25 MHz, it has a throughput of 10 Gbps. This calculator uses a pipeline configuration consisting of four basic CRC circuits, and has a latency of 4. The circuitry employs two input and one output selectors, keeping the delay to a minimum. While the CRC-32 (1-byte) data input signal section selector is shown as a four-input, one-output selector, it may be configured as a two-stage pipeline with two inputs and one output. The calculator uses a CRC-32 (8-byte) circuit to calculate the CRC-32 value from the head of the data to just before the remainder. From the remainder, the CRC-32 value is calculated using a CRC-32 circuit matched to the length of the remainder data. For example, if the remainder is six bytes, the CRC-32 (4-byte) circuit and CRC-32 (2-byte) circuit are used to calculate a CRC-32 value, and the CRC-32 circuits (8-byte and 1-byte) are not used. When calculating CRC value in an FCS, the first 32 bits of data are inverted. The final bit of the calculated CRC value is also inverted.

Figure 3:
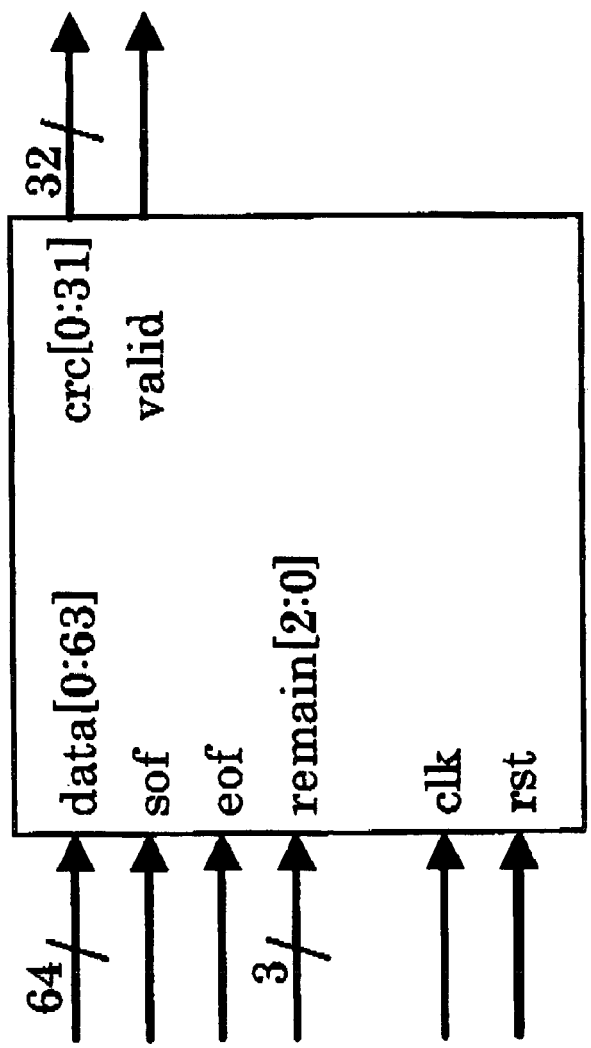
FIG. 3 is a diagram showing the flow of input/output signals of a CRC-32 value calculator.
Figure 5:
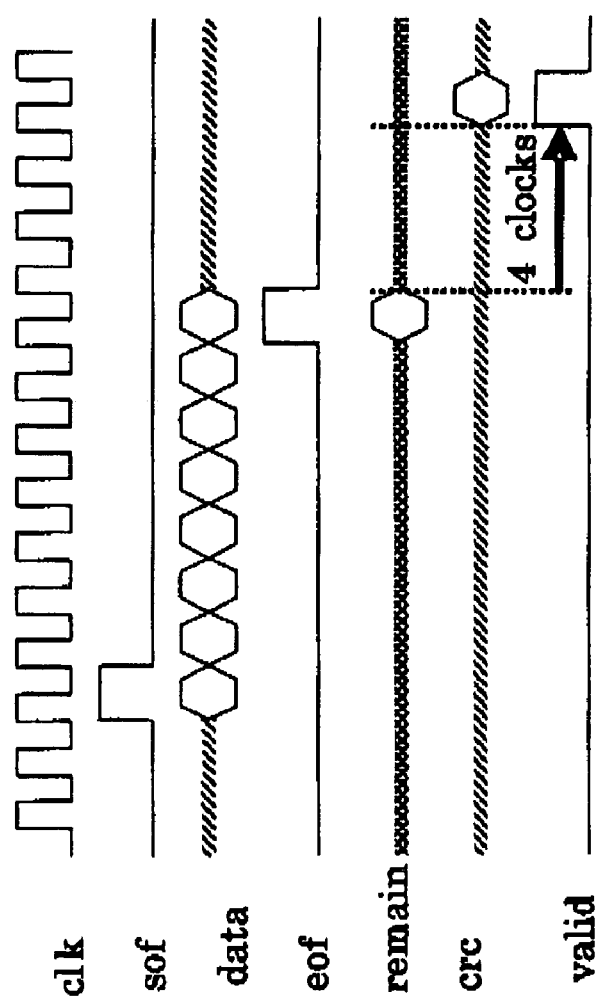
FIG. 5 shows the timing of the signals of FIG. 3.

Which CRC-32 circuit is used is determined by the remainder value (the byte length of the remainder data, denoted as "remain") and the start of frame (sof) signal. FIG. 3 shows the flow of input/output signals of a CRC-32 value calculator, and FIG. 4 provides an outline of the input/output signals of FIG. 3. FIG. 5 shows the timing of the signals of FIG. 3. Calculating a CRC-32 value from the data starts by providing the calculator with the first eight bytes of data and a sof signal. Then, the data is input to the calculator in eight-byte segments, until the remainder is reached. Finally, the remainder data, and the remainder byte length (remain) and eof (End Of Frame) signals are input. When this procedure is used, a CRC-32 value and a valid signal are obtained four cycles after the input of the eof signal.

EXAMPLE 2

Figure 7:
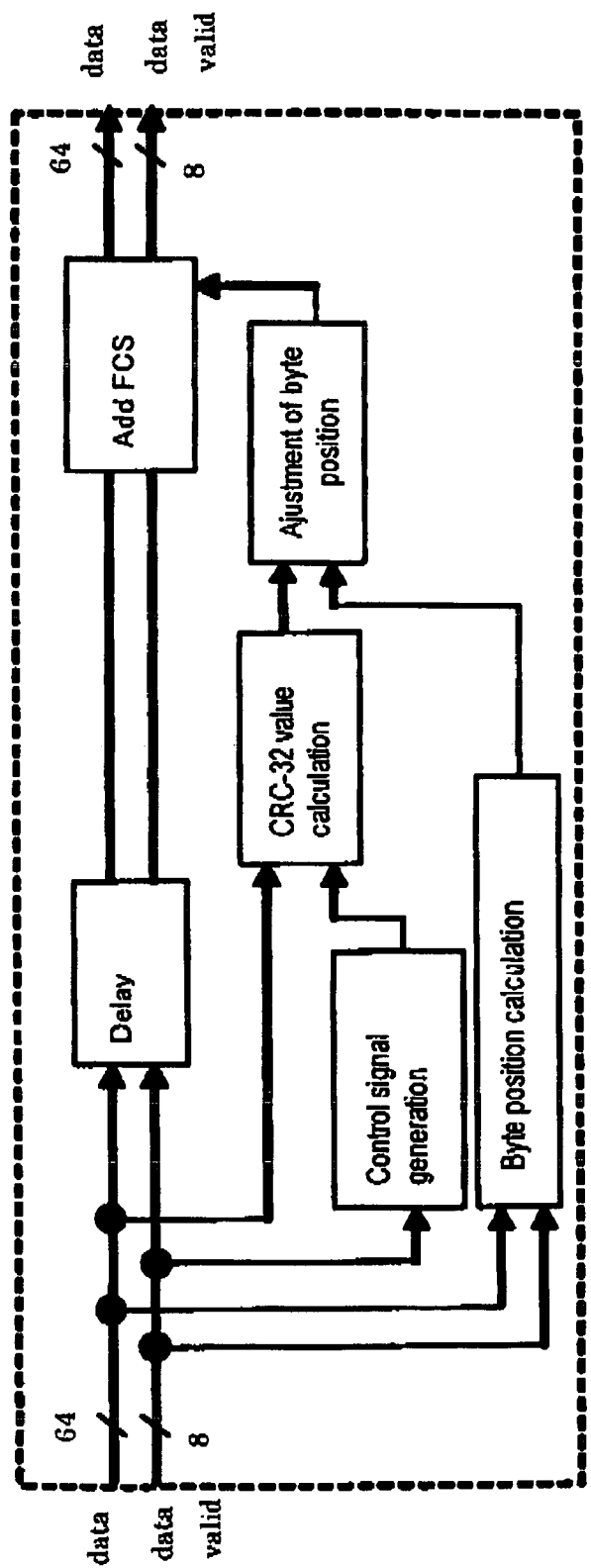
FIG. 7 is a block diagram showing the configuration of an apparatus that calculates a CRC-32 value and adds an FCS to Ethernet frames.

Next, when an Ethernet (registered trademark) frame data signal (data) of an arbitrary length, having no FCS appended, is input to the calculator of FIG. 7, together with a frame data valid signal (data valid), the calculator calculates a CRC-32 value and appends an FCS to the end of the Ethernet (registered trademark) frame. In this example, the calculator uses a process data width of eight bytes. The CRC-32 value calculator of FIG. 7 is the calculator shown with reference to Example 1, and is used mainly as part of the apparatus used to transmit Ethernet (registered trademark) frames.

EXAMPLE 3

Figure 8:
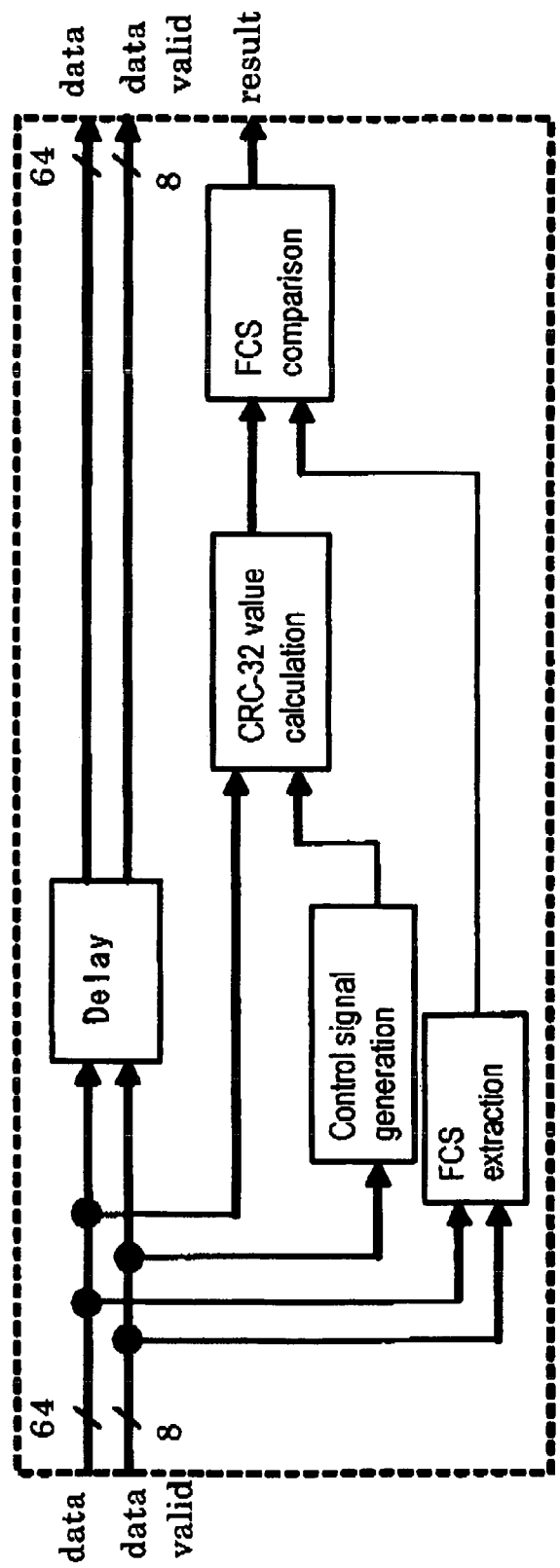
FIG. 8 is a block diagram showing the configuration of an apparatus that checks the Ethernet frame FCS.
Figure 9:
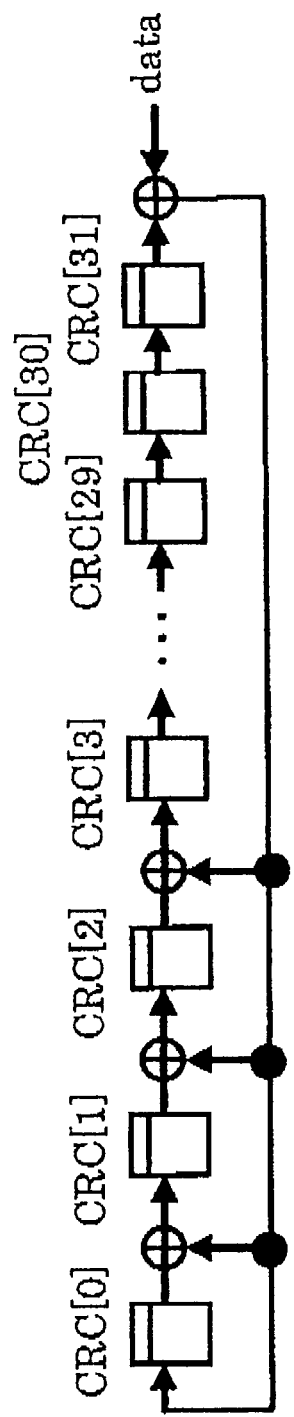
FIG. 9 is a block diagram of a known LFSR (Linear Feedback Shift Register).
Figure 10:
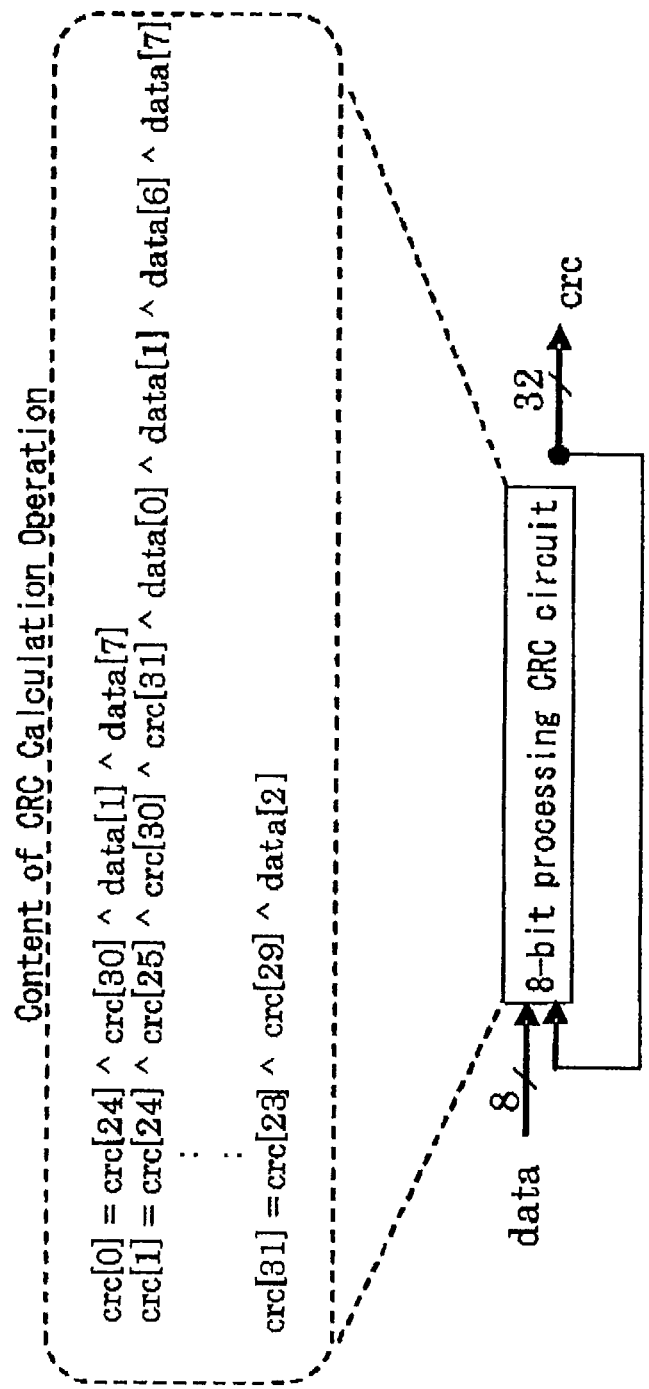
FIG. 10 is an example of a known CRC-32 circuit that calculates the CRC value of each byte.
Figure 11:
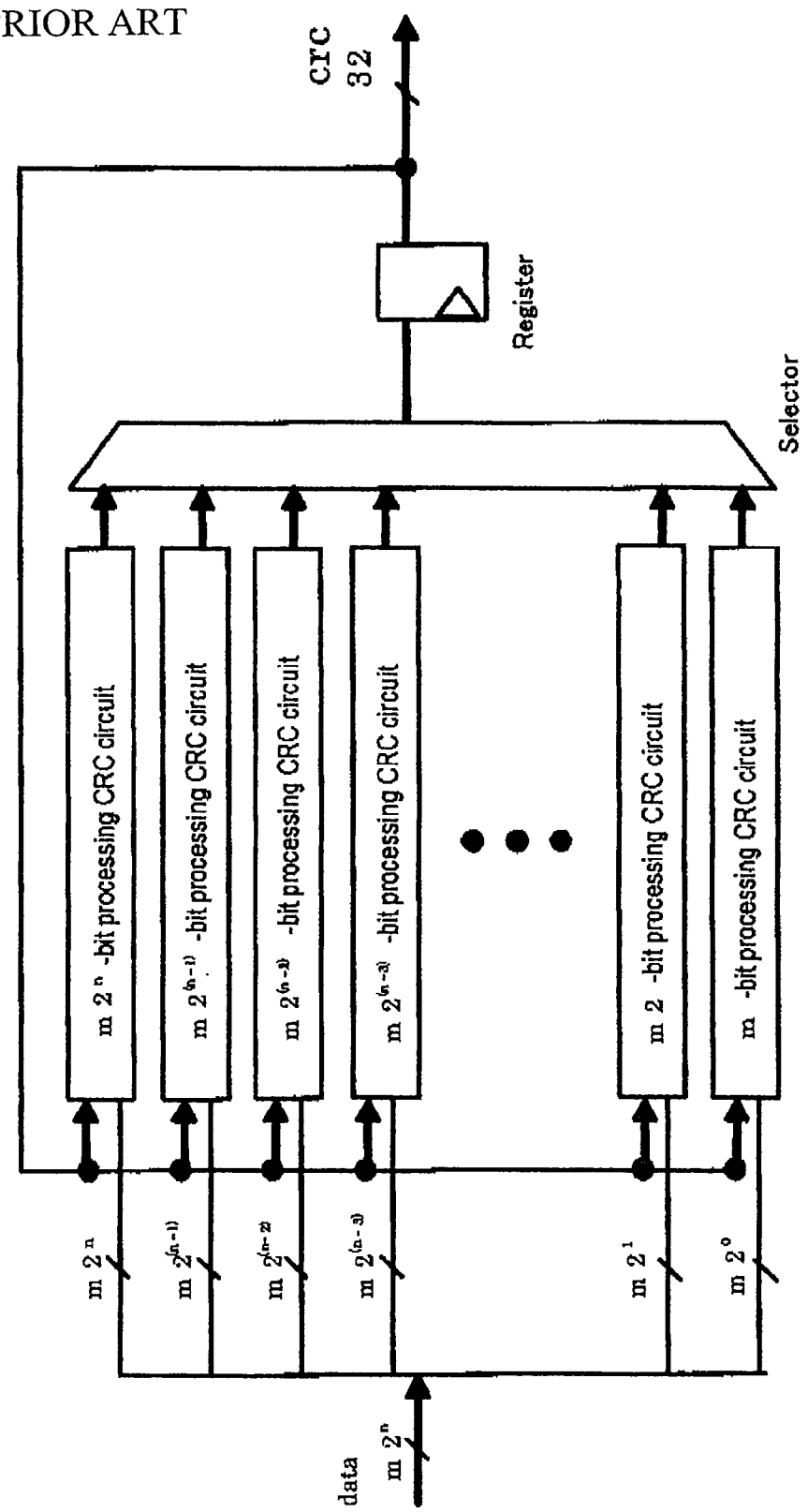
FIG. 11 is a block diagram showing the configuration of a conventional CRC-32 calculator during $m2^n$ bit processing.

Next, when an Ethernet (registered trademark) frame data signal (data) of an arbitrary length is input to the calculator of FIG. 8, together with a frame data valid signal (data valid), the calculator calculates a CRC-32 value, compares it with the FCS of the input Ethernet (registered trademark) frame and outputs the result. In this example, the calculator uses a process data width of eight bytes. The CRC-32 value calculator of FIG. 8 is the calculator shown with reference Example 1, and is used mainly as part of the apparatus used to receive Ethernet (registered trademark) frames.

EXAMPLE 4

Figure 12:
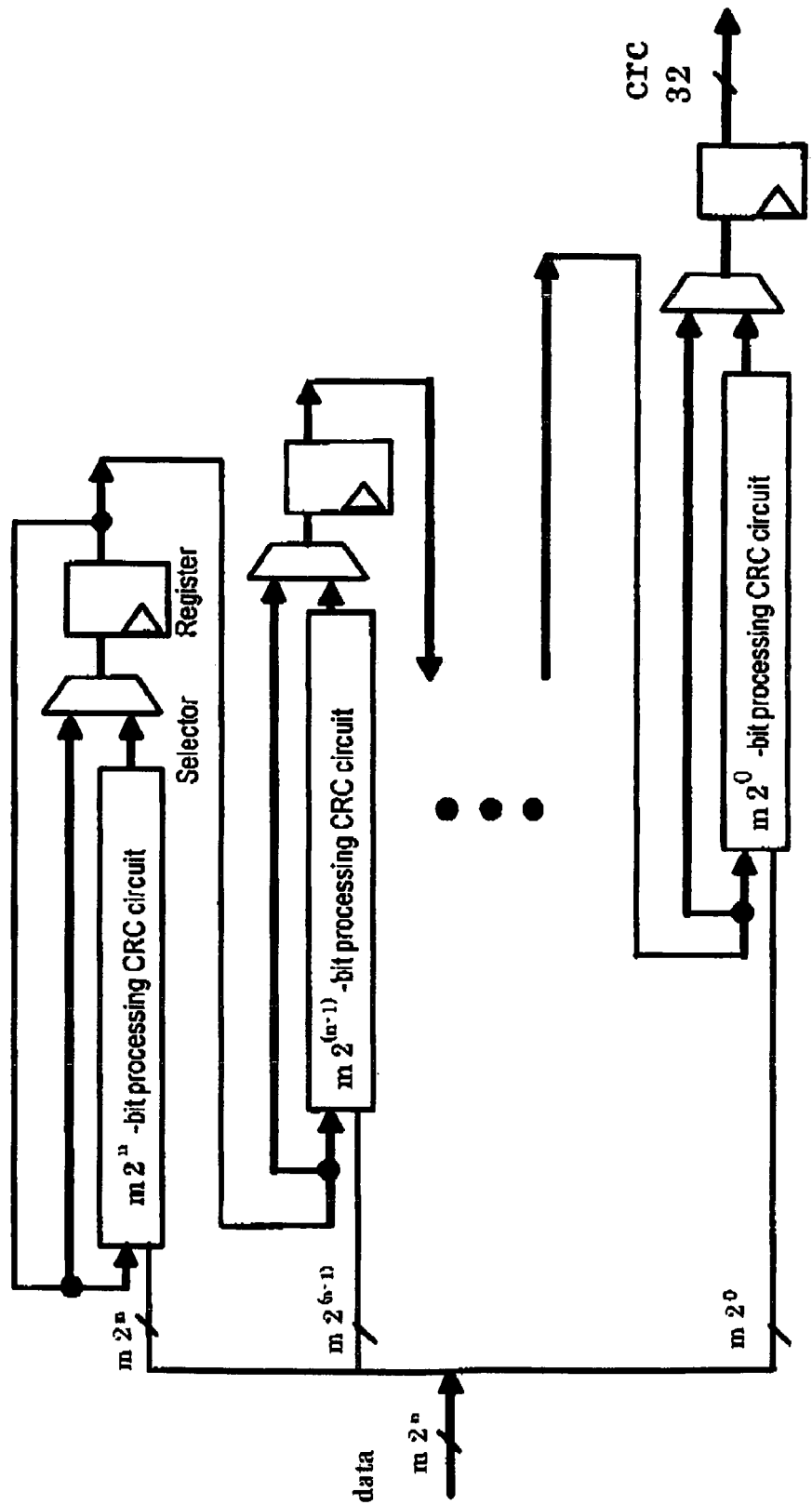
FIG. 12 is a block diagram showing the configuration of the CRC value calculator of the present invention during $m2^n$ bit processing.

Shown in FIG. 12 is a CRC value calculator that calculates CRC values from input variable-length data, wherein, when natural numbers n, m are predetermined, calculator data is processed in $m2^n$-bit units, the CRC value calculator comprises (n+1)-fixed-length processing unit CRC circuits comprising a 0th CRC circuit in which the processing unit is a fixed length of $m2^n$ bits, a 1st CRC circuit in which the processing unit is a fixed length of $m2^{(n-1)}$ bits, continuing in order to an (n)th CRC circuit in which the processing unit is a fixed length of $m2^0$ bits, wherein the CRC circuits are each equipped with a register and are connected in series by respective selectors, characterized in that $m2^n$ bits of data and an output of the 0th CRC circuit itself are input to the 0th CRC circuit and, via the 0th selector, output to the 0th CRC circuit itself and to the 1st CRC circuit, and in respect of integers k from 1 to n, $m2^{(n-k)}$ bits of data and an output of the (k−1)th CRC circuit are input to the (k)th CRC circuit and, via the '(k)th selector, are output to the (k+1)th CRC circuit, the 0th selector is a selector for selecting the output of the 0th CRC circuit or the output of the 0th CRC circuit itself that is the input signal, the (k)th selector is a selector for selecting one of the output of the (k−1)th CRC circuit and an output of the (k)th CRC circuit, and a calculated CRC value is output via the nth selector. The 0th selector selects the output of the 0th CRC circuit when the data length is $m2^n$, and the (k)th selector determines selection or non-selection of the output of the (k)th CRC circuit in accordance with a value of a digit corresponding to the (k)th selector in a binary notation of the process data length.

EXAMPLE 5

Figure 13:
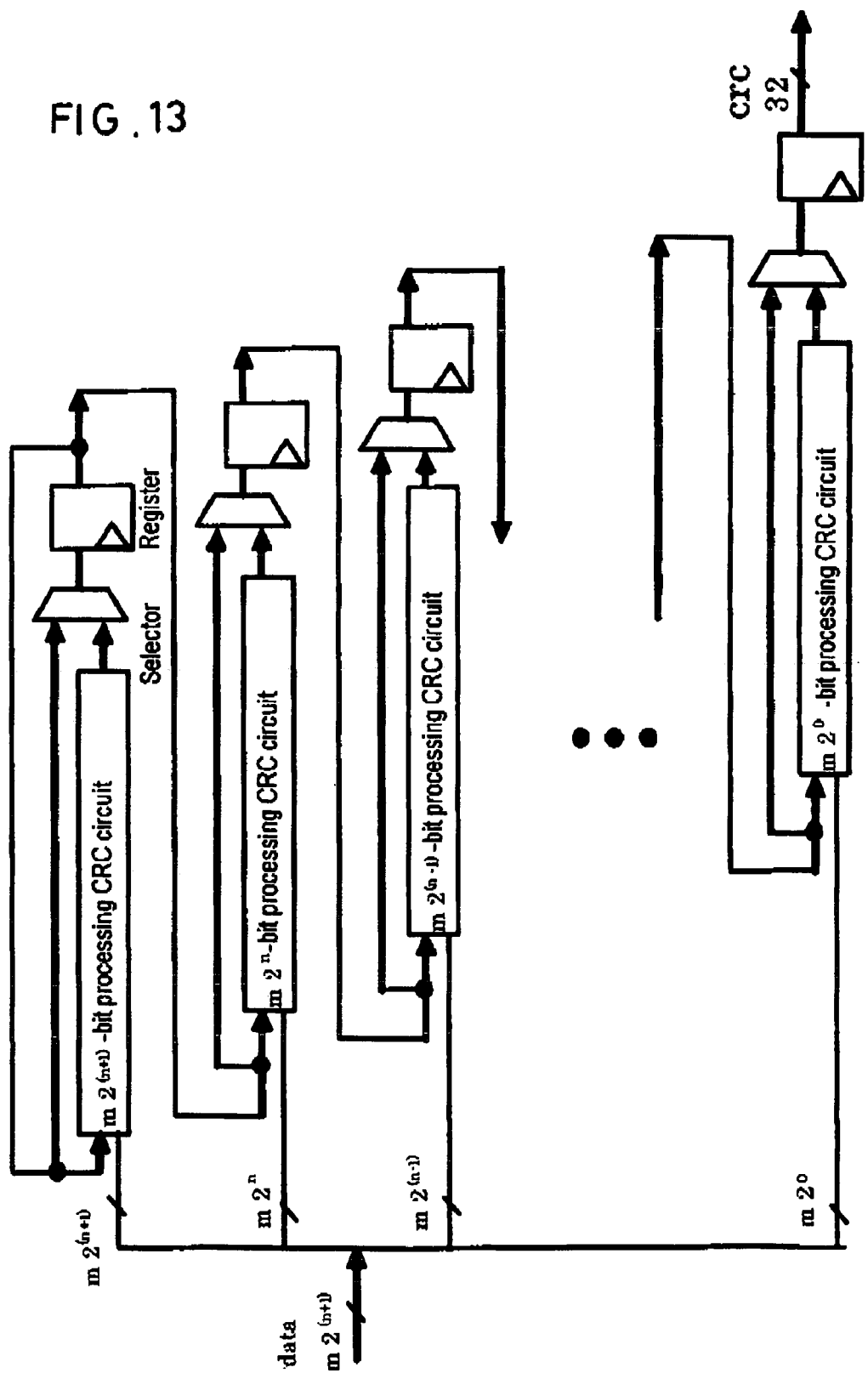
FIG. 13 is a block diagram showing the configuration of the CRC value calculator of the present invention during $(m2^n+t)$ bit processing.

Shown in FIG. 13 is a CRC value calculator that calculates CRC values from input variable-length data, wherein, when natural numbers n, m and a natural number t that is smaller than $m2^n$ are predetermined, calculator data is processed in $(m2^n+t)$-bit units, the CRC value calculator comprises (n+2)-fixed-length processing unit CRC circuits comprising a pre-CRC circuit in which the processing unit is a fixed length of $(m2^n+t)$ bits, a 0th circuit in which the processing unit is a fixed length of $m2^n$ bits, a 1st CRC circuit in which the processing unit is a fixed length of $m2^{(n-1)}$ bits, continuing in order to an (n)th CRC circuit in which the processing unit is a fixed length of $m2^0$ bits, wherein the CRC circuits are each equipped with a register and are connected in series by respective selectors, characterized in that $(m2^n+t)$ bits of data and output of the CRC circuit itself are input to the pre-CRC circuit and, via a pre-selector, output to the CRC circuit itself and to the 1st CRC circuit, and in respect of integers k from 0 to n, $m2^{(n-k)}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit or the output of the CRC circuit itself that is the input signal, the (k)th selector is a selector for selecting one of an output of the (k−1)th CRC circuit and an output of the (k)th CRC circuit, and a calculated CRC value is output via the (n)th selector. The pre-selector is a selector for selecting the output of the 0th CRC circuit when the data length is $(m2^n+t)$, and the (k)th selector determines selection or non-selection of the output of the (k)th CRC circuit in accordance with a value of a digit corresponding to the (k)th selector in a binary notation of the process data length.

EXAMPLE 6

Figure 14:
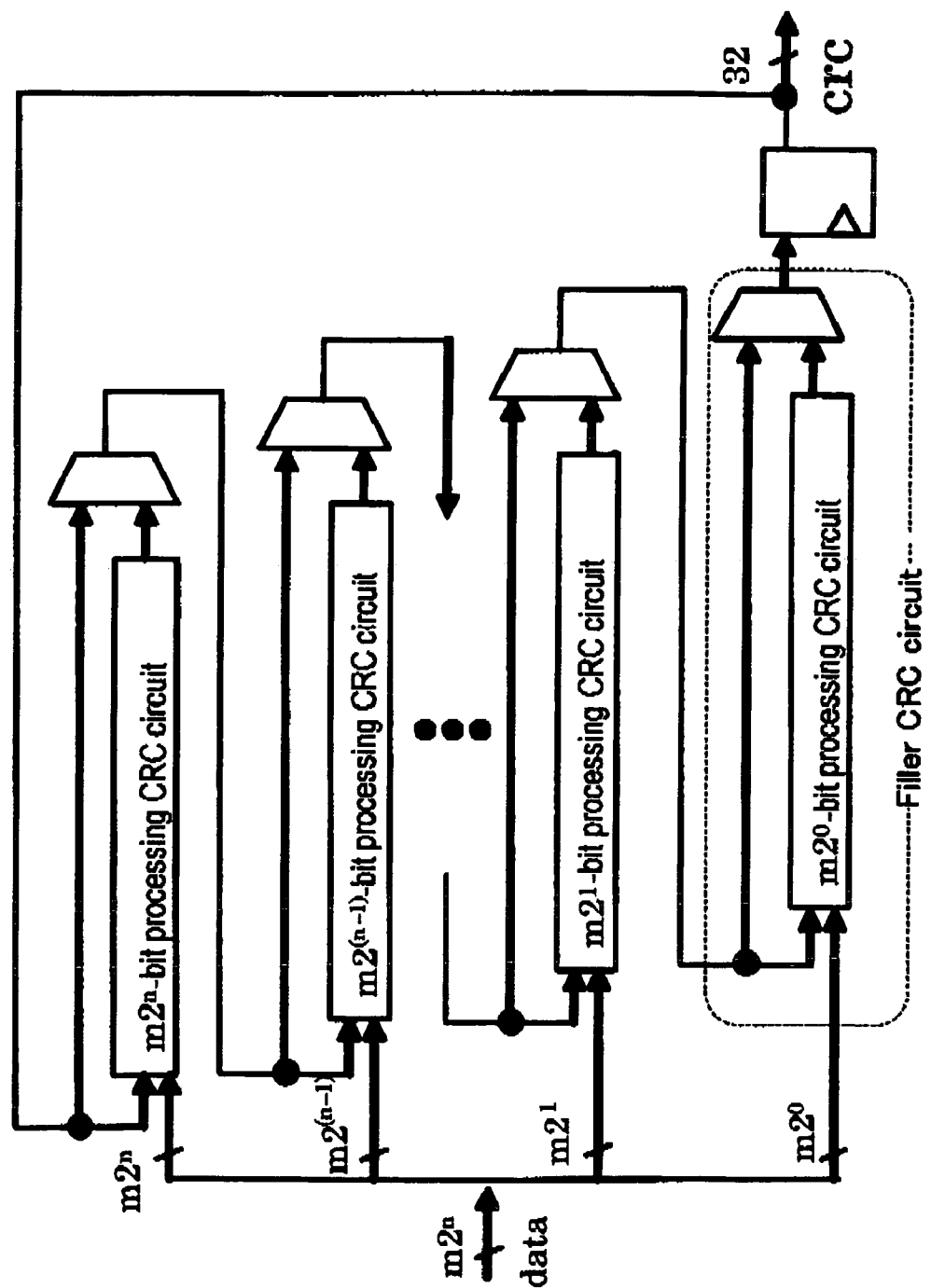
FIG. 14 is a block diagram of the CRC value calculator equipped with a filler CRC circuit.

As described in the foregoing, with respect to the circuit shown in FIG. 2, when the target data length is 64 bytes, processing is performed using just the 8-byte processing CRC circuit, with the 4-byte processing CRC circuit, 2-byte processing CRC circuit and 1-byte processing CRC circuit being virtually unused. In contrast, in the case of the circuit shown in FIG. 14, the processing of 64 bytes is done using the 4-byte processing CRC circuit, 2-byte processing CRC circuit and 1-byte processing CRC circuit, plus another 1-byte processing CRC circuit. That is, a filler CRC circuit has been added to the above configuration, which in the case of FIG. 14 is the one located at the bottom. The location of this circuit is arbitrary and may therefore be decided according to the other elements. This arrangement enables the 8-byte processing CRC circuit to be replaced by a 1-byte processing CRC circuit, thereby keeping the size of the circuitry under control.

Expressed in a more general-purpose manner, the CRC value calculator of the invention is one that calculates CRC values from input variable-length data, wherein, when natural numbers n, m are predetermined, calculator data is processed in $m2^{(n+1)}$-bit units, the CRC value calculator comprises (n+2)-fixed-length processing unit CRC circuits comprising a pre-CRC circuit in which the processing unit is a fixed length of $m2^n$ bits, a 0th CRC circuit in which the processing unit is a fixed length of $m2^n$ bits, a 1st CRC circuit in which the processing unit is a fixed length of $m2^{(n-1)}$ bits, and continuing in order, a CRC circuit in which the processing unit is a fixed length of $m2^0$ bits, and to an CRC circuit that is an (n+1)th CRC circuit in which the processing unit is a fixed length of $m2^0$, wherein the CRC circuits are connected in series by respective selectors and registers, characterized in that data that is subject to CRC value calculation that has been input to the calculator divided into segments every ($m2^n$+t) bits from the head thereof, and register output, are input to the pre-CRC circuit, and a CRC value calculated and output to the 1st CRC circuit via a pre-selector, and in respect of integers k from 0 to n, $2^{(n-k)}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit when the data that is subject to CRC value calculation is divided into ($m2^n$+t)-bit lengths, and for selecting the output of the CRC circuit itself that is the input signal when the data that is subject to CRC value calculation is not divided into ($m2^n$+t)-bit lengths, the (n+1)th selector is a selector for selecting one of the output of the (k−1)th CRC circuit corresponding to the data lengths into which the data that is subject to CRC value calculation is divided, and the output of the (n)th CRC circuit, and a calculated CRC value is output via the (n)th selector.

In the foregoing the present invention has been described with reference to network-related fields, in particular data communications, but can be applied to a wide range of apparatuses that use error-detection circuits for the correction of errors. For example, it can be applied to storage devices that carry out reading and writing at high speed.

What is claimed is:

1. A CRC value calculator that calculates CRC values from input variable-length data, wherein, when natural numbers n, m are predetermined, calculator data is processed in ($m2^n$)-bit units, the CRC value calculator comprises (n+1)-fixed-length processing unit CRC circuits comprising a 0th CRC circuit in which the processing unit is a fixed length of $m2^n$ bits, a 1st CRC circuit in which the processing unit is a fixed length of $m2^{(n-1)}$ bits, continuing in order to an nth CRC circuit in which the processing unit is a fixed length of $m2^0$ bits, wherein the CRC circuits are each equipped with a register and are connected in series by respective selectors, characterized in that $m2^n$ bits of data and an output of the 0th CRC circuit itself are input to the 0th CRC circuit and, via the 0th selector, output to the 0th CRC circuit itself and to the 1st CRC circuit, and in respect of integers k from 1 to n, $m2^{(n-k)}$ bits of data and an output of the (k−1)th CRC circuit are input to the (k)th CRC circuit and, via the (k)th selector, are output to the (k+1)th CRC circuit, the 0th selector is a selector for selecting the output of the 0th CRC circuit or the output of the 0th CRC circuit itself that is the input signal, the (k)th selector is a selector for selecting one of the output of the (k−1)th CRC circuit and an output of the (k)th CRC circuit, a calculated CRC value is output via the (n)th selector, the 0th selector selects the output of the 0th CRC circuit when the data length is $m2^n$, and the (k)th selector determines selection or non-selection of the output of the (k)th CRC circuit in accordance with a value of a digit corresponding to the (k)th selector in a binary notation of the process data length.

2. A CRC value calculator that calculates CRC values from input variable-length data, wherein, when natural numbers n, m and a natural number t that is smaller than $m2^n$ are predetermined, calculator data is processed in ($m2^n$+t) bit units, the CRC value calculator comprises (n+2)-fixed-length processing unit CRC circuits comprising a pre-CRC circuit in which the processing unit is a fixed length of ($m2^n$+t) bits, a 0th circuit in which the processing unit is a fixed length of $m2^n$ bits, a 1st CRC circuit in which the processing unit is a fixed length of $m2^{(n-1)}$ bits, continuing in order to an nth CRC circuit in which the processing unit is a fixed length of $m2^0$ bits, wherein the CRC circuits are each equipped with a register and are connected in series by respective selectors, characterized in that data that is subject to CRC value calculation that has been divided into segments every ($m2^n$+t) bits from the head thereof and input to the calculator, and output of the CRC circuit itself, are input to the pre-CRC circuit, an a CRC value calculated and, via a pre-selector, output to the CRC circuit itself and to the 1st CRC circuit, and in respect of integers k from 0 to n, $2^{(n-k)}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit when the data that is subject to CRC value calculation is divided into ($m2^n$+t)-bit lengths, and for selecting the output of the CRC circuit itself that is the input signal when the data that is subject to CRC value calculation is not divided into ($m2^n$+t)-bit lengths, the (k)th selector is a selector for selecting one of an output of the (k−1)th CRC circuit corresponding to the data length of the segmented data subject to CRC value calculation and an output of the (k)th CRC circuit, a calculated CRC value is output via the nth selector, the pre-selector selects the output of the 0th CRC circuit when the data length is ($m2^n$+t), and the (k)th selector determines selection or non-selection of the output of the (k)th CRC circuit in accordance with a value of a digit corresponding to the (k)th selector in a binary notation of the process data length.

3. A CRC value calculator that calculates CRC values from input variable-length data, wherein, when natural numbers n, m are predetermined, calculator data is processed in $m2^{(n+1)}$-bit units, the CRC value calculator comprises (n+2)-fixed-length processing unit CRC circuits comprising a pre-CRC circuit in which the processing unit is a fixed length of $m2^n$ bits, a 0th CRC circuit in which the processing unit is a fixed length of $m2^n$ bits, a 1st CRC circuit in which the processing unit is a fixed length of $m2^{(n-1)}$ bits, and continuing in order, a CRC circuit in which the processing unit is a fixed length of $m2^0$ bits, and to an CRC circuit that is an (n+1)th CRC circuit in which the processing unit is a fixed length of $m2^0$, wherein the CRC circuits are connected in series by respective selectors and registers, characterized in that data that is subject to CRC value calculation that has been input to the calculator divided into segments every $(m2^n+t)$ bits from the head thereof, and register output, are input to the pre-CRC circuit, and a CRC value calculated and output to the 1st CRC circuit via a pre-selector, and in respect of integers k from 0 to n, $2^{(n-k)}$ bits of data and an output of the (k−1)th CRC circuit are input to the (k)th CRC circuit and, via the (k)th selector, are output to the (k+1)th CRC circuit, the pre-selector is a selector for selecting the output of the pre-CRC circuit when the data that is subject to CRC value calculation is divided into $(m2^n+t)$-bit lengths, and for selecting the output of the CRC circuit itself that is the input signal when the data that is subject to CRC value calculation is not divided into $(m2^n+t)$-bit lengths, the (n+1)th selector is a selector for selecting one of the output of the (k−1)th CRC circuit corresponding to the data lengths into which the data that is subject to CRC value calculation is divided, and the output of the (n)th CRC circuit, and a calculated CRC value is output via the (n)th selector.

* * * * *

UNITED STATES PATENT AND TRADEMARK OFFICE
CERTIFICATE OF CORRECTION

| | | |
|---|---|---|
| PATENT NO. | : 7,590,916 B2 | Page 1 of 1 |
| APPLICATION NO. | : 11/449794 | |
| DATED | : June 9, 2006 | |
| INVENTOR(S) | : Katashita et al. | |

It is certified that error appears in the above-identified patent and that said Letters Patent is hereby corrected as shown below:

On the title page, Item (73), the Assignees' information has been omitted. Item (73) should read:

-- (73)  National Institute of Advanced Industrial Science and Technology, Tokyo (JP)
Duaxes Corporation, Tokyo (JP)
Bits Co., Ltd., Tokyo (JP) --

Signed and Sealed this

Fifth Day of January, 2010

David J. Kappos
*Director of the United States Patent and Trademark Office*